United States Patent
Degani et al.

[11] Patent Number: 6,160,715
[45] Date of Patent: Dec. 12, 2000

[54] TRANSLATOR FOR RECESSED FLIP-CHIP PACKAGE

[75] Inventors: Yinon Degani, Highland Park; Thomas Dixon Dudderar, Chatham; Robert Charles Frye, Piscataway; King Lien Tai, Berkely Heights, all of N.J.

[73] Assignee: Lucent Technologies Inc., Murray Hill, N.J.

[21] Appl. No.: 09/149,804

[22] Filed: Sep. 8, 1998

[51] Int. Cl.[7] .................................................. H05K 7/10
[52] U.S. Cl. ........................ 361/767; 361/772; 361/774; 257/723; 257/776; 257/777; 257/778; 438/108
[58] Field of Search .................................. 361/767, 772, 361/774, 803, 794; 257/723, 776–778, 737, 738; 438/108

[56] References Cited

U.S. PATENT DOCUMENTS

| | | | |
|---|---|---|---|
| 5,490,324 | 2/1996 | Newman | 29/830 |
| 5,796,170 | 8/1998 | Marcantonio | 257/786 |
| 5,906,042 | 5/1999 | Lan et al. | 29/852 |

*Primary Examiner*—Jeffrey Gaffin
*Assistant Examiner*—Tuan Dinh
*Attorney, Agent, or Firm*—Thomas, Kayden, Horstemeyer & Risley LLP

[57] ABSTRACT

The specification describes a recessed chip IC package in which the IC chip is bonded to a translator, and power and ground planes for IC power and ground interconnections are formed on separate interconnect levels of the translator. The multilevel interconnection capability of the translator allows crossovers, and allows power and ground pins from the IC chip to be both isolated from signal I/Os, and consolidated into fewer interconnections going to the next board level. The translator also has a large area outboard of the IC chip area to allow fan out from high pin count chips to large pitch interconnection sites for interconnection to the next board level.

18 Claims, 3 Drawing Sheets

TRANSLATOR FOR RECESSED FLIP-CHIP PACKAGE

FIELD OF THE INVENTION

This invention relates to flip chip integrated circuit (IC) packages and more specifically to IC packages in which IC chips are recessed into cavities in an interconnection substrate. More specifically it relates to a recessed chip interconnection arrangement in which a single IC chip is interconnected to a translator to provide increased interconnect density.

1. Background of the Invention

Recessed chip IC packages are gaining acceptance in IC device interconnection technology because of efficient utilization of interconnect substrate area, low overall package profile, and reduced interconnection length. A variety of recessed chip package options are described and claimed in U.S. Pat. No. 5,608,262, issued Mar. 4, 1997 which, for purposes of this disclosure, is incorporated herein by reference.

Recessed chip packages are characterized by three components, a primary IC chip or chips, defined for the purpose of this exposition as a first level component, an intermediate interconnection substrate (IIS) which (in a conventional package) may be either an IC chip or a passive interconnection substrate, defined here as a second level component, and a system interconnection substrate (SIS) which is typically a printed circuit board (PCB) and defined as a third level component. These components are progressively larger in area so that the second level component(s) can support one or more IC chips, and the third level components can accommodate one or more second level components. In a three component package, the first level components are typically flip-chip bonded to the second level components, and the second level components are flip-bonded to the third level component, with the first level components recessed into cavities formed in the third level component.

A number of variations using this basic concept are possible, e.g. the system interconnection substrate can itself function as an intermediate interconnection substrate and attach to a fourth board level, with the second level components recessed into cavities in the fourth level component.

Recessed cavity structures have efficient interconnection arrangements, but there is an ever growing need for denser interconnections and higher interconnection performance.

2. Statement of the Invention

We have developed a improved interconnection approach for recessed chip IC packages. Among the improvements is an improved power and ground interconnection arrangement using isolated power and ground planes built into a multilevel interconnection translator. In the preferred embodiment of the invention the translator is silicon, and the power and ground planes comprise separate interconnection levels on the translator. The multilevel interconnection feature of the translator allows both consolidation of the number of power and ground interconnections at this board level, and re-routing of power and ground I/Os, and signal I/Os, to the next board level. Also, the translator of the invention accommodates a single high pin count IC chip, and is made substantially larger than the IC chip. The large translator area allows both routing and fan out on the silicon translator.

DETAILED DESCRIPTION

State of the art IC chips are now produced with I/O counts that exceed 400. When the number of required interconnections required is this large, the pitch for solder bond interconnections in prior art arrangements is prohibitively small. Conventional interconnection strategies cannot meet the challenge of interconnecting these large IC arrays of interconnections.

Figure 1:
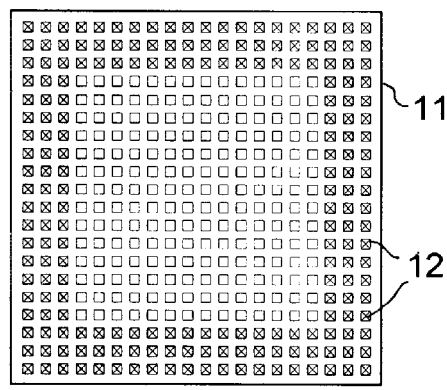
FIG. 1 is a plan view of a high pin count IC chip.

An IC chip with a large area array of interconnection sites is shown in FIG. 1. The IC chip is designated 11, and the area array interconnections sites are designated 12. The interconnection sites are shown as square but can be round. In a typical illustration the bonding pads are shown, and these can be square but more often are round. In the IC chip design of FIG. 1, the three rows of edge arrayed sites 12, shown with an "x", are signal I/Os, and the interior sites 13, without an "x", are power and ground. These assignments can be changed depending on the circuit design, i.e. the pins can be mixed between signal and power/ground. FIG. 1 shows a total of 400 IC chip interconnection sites, with 196 assigned to power and ground, and 204 assigned to signal. In state of the art IC chips, the combined number of I/O interconnections may be much larger than 400, which more closely represents the interconnection change that is addressed by this invention.

The improved interconnection approach, according to the invention, is to use a translator for the second interconnect level, i.e. the substrate to which the IC chip is bonded, and to construct the translator as a large module with multilevel interconnections, so that the large array of interconnections can be accommodated and can cross over, re-route, and fan out. The added area for the translator depends on the number of area array interconnections and the pitch desired for these interconnections. In a typical arrangement according to the invention, the area of the translator is at least 4, and preferably 6, times the area of the IC chip.

Figure 2:
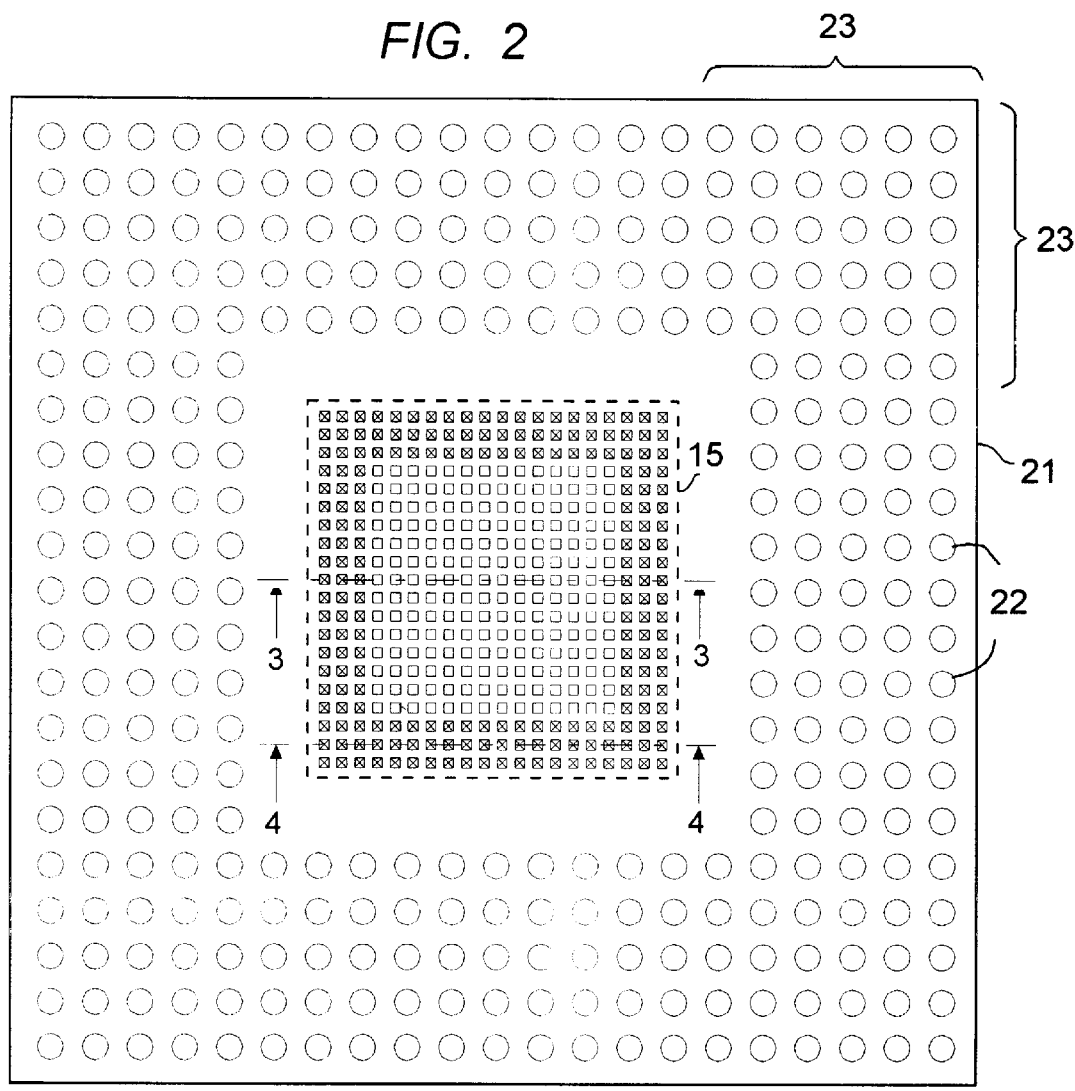
FIG. 2 is a plan view of a translator according to the invention.

A translator for interconnecting the IC chip of FIG. 1 according to the invention is shown in FIG. 2. The central portion of the translator 21 accommodates the IC chip, which flip-chip bonded to the translator. The position of the IC chip is shown at 15 in phantom. The array of IC interconnection sites on the translator mirrors the array on the IC chip. The translator 21 shown in FIG. 2 has an area approximately 7 times the area of the IC chip. The added area 23 outside the IC chip area accommodates interconnection sites 22. This added area is referred to herein as the outboard area, and the interconnection sites in this area are for connections to the next board level.

In the embodiment of FIG. 2 the outboard area accommodates 320 interconnection sites. This number is less than the 400 interconnection sites on the IC chip and is a deliberate choice for reasons that will become apparent. It should be evident that pin for pin sites could be accommodated in the outboard area of the translator of FIG. 2, and still have substantially greater pitch than the pitch of the IC chip interconnections. This design also utilizes the large area of the translator 21 outboard of the chip site to fan out the large array of interconnections, i.e. to increase the pitch of the outboard interconnections that go to the next level. The advantage of having a large pitch at this level in the package is that the translator can be flip-bonded to a printed wiring board or a ball grid array (BGA) using large solder bumps or balls. Large solder interconnections are more reliable and can be made with higher yield. The bump or ball pads at the interconnection sites 22 are solder wettable pads of e.g. Cu—Cr alloy or Ti—Pt—Au.

In typical translator structures according to the invention the pitch of the interconnections in the outboard will be larger than the pitch of the IC interconnections. If the outboard area is more than four times the IC chip area, the pitch of the interconnection sites in the outboard area will normally be at least twice the pitch of the IC interconnections at the IC chip site. The pitch is the center-to-center spacing between interconnections sites.

Figure 3:
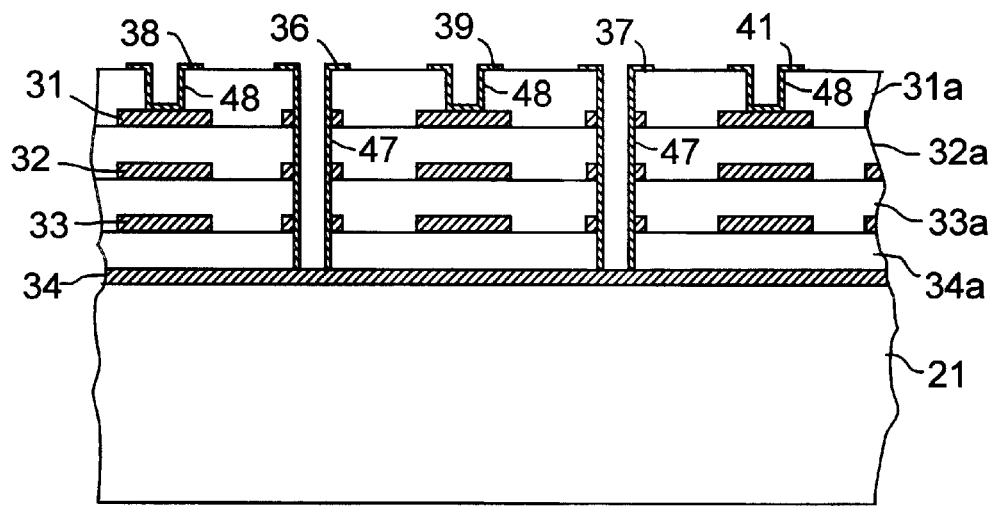
FIG. 3 is a partial cross section through 3—3 of FIG. 2.

A partial cross section of the translator of FIG. 2, including five of the area interconnection sites in the center region, is shown in FIG. 3. FIG. 3 is a detailed view of a portion of the center of the section 3—3 of FIG. 2. An important feature of this package design is evident in this figure, where the multilevels of interconnection can be seen. The U-shape of each of the interconnections 36, 37, 38, 39 and 41 represents the conventional solder wettable metal.

In the interconnection arrangement of FIG. 3 the area array in the center of the IC chip site is for power and ground interconnections. The translator according to the invention has special features for power and ground interconnections. A single interconnect level is reserved for power, and another level, preferably isolated from the first level by intervening levels, is reserved for the ground interconnections. FIG. 3 shows four levels of interconnection 31, 32, 33, and 34. For clarity, the interlevel dielectric layers are not individually shown in the figures but it will be evident to those skilled in the art that there is a first interlevel dielectric layer 34a between conductive layers 33 and 34, a second interlevel dielectric layer 33a between conductive layers 32 and 33, a third interlevel dielectric layer 32a between conductive layers 31 and 32, and a top dielectric layer 31a between conductive layer 31 and the pads 36, 37, 38, 39 and 41. The bottom conductive level, 34, is a ground plane, and the top level 31 is a power plane. The two intermediate conductive levels 32 and 33 are assigned to signal I/Os. Conductive levels 31–33 are each shown with conductor patterns to illustrate the multilevel concept. In the view shown, if all the interconnections in the area array are power and ground, the conductor pattern for the second and third levels may be absent in this view. However, providing conductor patterns in the center section offers the designer the option of intermixing signal I/Os and power and ground I/Os at any location on the IC chip, and therefore at any corresponding location in the center of the translator. The arrangement shown, with the intermediate levels assigned to signal I/Os and the top and bottom levels to power and ground respectively, has the advantage of isolating power and ground, but other assignations are obviously useful. The bottom interconnect level 34, which may be assigned either power or ground, or both, but is preferably the ground plane, is shown as a continuous sheet since no interconnections are made through this level. The ground plane can be the substrate, e.g. doped silicon, but for higher conductivity the substrate can be coated with a more conductive material e.g. Al, Ti—Pd—Au, or Au. The interconnect level 31 is a mesh of conductive material with openings as shown. The interconnection sites 36 and 37 are connected to the ground plane 34, and interconnection sites 38, 39 and 41 are connected to the power plane 31. The power and ground planes extend throughout the translator area, so that any one of the pads 22 can be connected to power and ground by providing a via to level 31 or 34 at the desired site in the outboard region of the translator.

Figure 4:
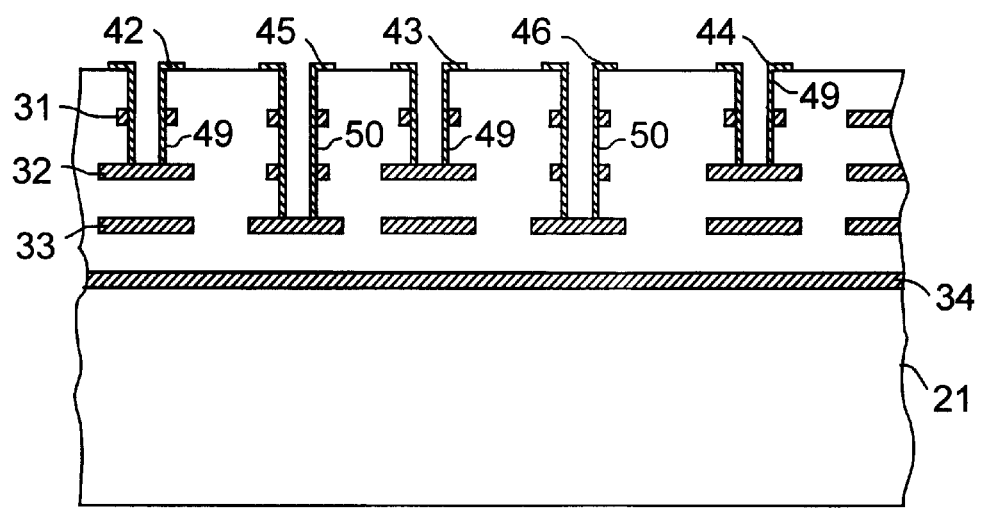
FIG. 4 is a partial cross section through 4—4 of FIG. 2.

A section view of the rows of interconnection sites at the edge of the array, i.e. those with an "x" in FIG. 2 and assigned to signal I/Os in this embodiment, is given in FIG. 4 which is a view of a portion of FIG. 2 along section 4—4. Here edge array interconnection sites 42, 43 and 44 are connected to interconnect level 32 using vias as shown, and interconnection sites 45 and 46 are connected to level 33. The conductor patterns for levels 32 and 33 are conventional, i.e. a single runner connecting site 42 with a selected site 22 in the 20 outboard region. By contrast, the power and ground interconnections from the IC chip are aggregated together on the power and ground plane sheets. As described above the ground sheet is continuous and the power sheet is a mesh. Interconnections are made to these sheets at any desired site 22 in the outboard region using an appropriate via. This allows the circuit designer the freedom to re-route power and ground, and to change the number of power and ground interconnections coming off the translator from the number coming on.

FIG. 2 shows 204 IC chip signal I/O interconnection sites, and 196 power and ground interconnection sites. However, there are just 320 interconnection sites 22 in the outboard region of the translator. Typically, each signal I/O from the IC chip is interconnected pin for pin at each board level, which consumes 204 of the 320 sites, leaving 116 for power and ground. As is evident from the above description, the power and ground interconnections between board levels are not discrete. In a typical circuit design, there is a need for a large number of power and ground interconnection sites, spaced around the outboard region, but typically this number is significantly fewer than the number of power and ground interconnections that come off the IC chip. Thus the translator of the invention serves both to consolidate the power and ground connections, and redistribute them spatially. This consolidation function at a board level that in the prior art has been primarily a 1 for 1 pass through level, is an important advance in recessed flip chip packaging. Reducing power and ground interconnections by, e.g., at least 10% is regarded as significant. In addition, the ability to design crossovers at this board level, to achieve re-routing, to isolate power and ground, and to achieve fan out represents a major advance in interconnect technology.

Figure 5:
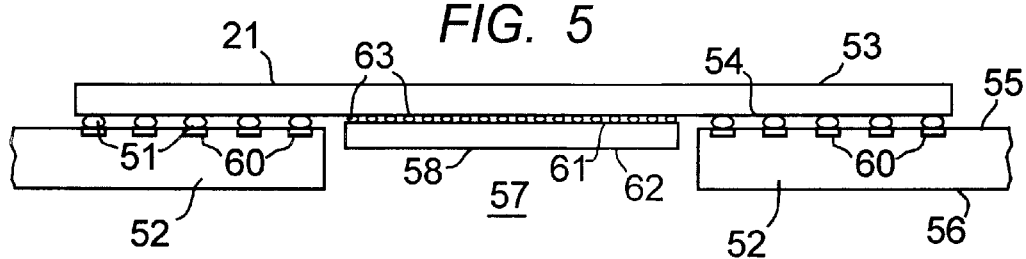
FIG. 5 is a front partial view of an assembled IC package with the translator of FIG. 2.

In FIG. 5, the translator 21 with upper surface 53 and lower surface 54, is shown ball or bump soldered, by a series of interconnections 51 on the lower surface thereof to the next board level 52, with the IC chip recessed as shown. Printed wiring board 52 with upper surface 55 and lower surface 56, is preferably a ball grid array which provides reliable bonding of the many I/O leads from the translator to the next board level. The board level 52 may be an intermediate board level, or may be the system printed wiring board (PWB), i.e. the mother board. In either case an opening 57, e.g. a quadrilateral cavity is provided in this level where the IC chip 58 is recessed. The IC chip has upper surface 61 and lower surface 62, with interconnections 63 on the upper surface bonding the IC chip to the translator 21. It will be noted that the solder balls interconnecting the translator 21 to the board 52 are substantially larger than those interconnecting the IC chip to the translator. The IC chip interconnections are typically flip-chip micro-joints of e.g. 50 to 200 microns in diameter, while the BGA balls are typically 20 to 100 mils in diameter.

It should be evident that the invention is applicable to PWB interconnection arrangements wherein the cavity for the IC chip extends completely through the thickness of the board, and the IC chip is mounted so as to recess significantly below the surface of the board, thus reducing the package profile. These structures, and the cavity for the IC chip, are quadrangular in shape, and frequently square in shape. In principle, recessed chip packages can be made with the IC chip recessed into a depression, i.e. the cavity for the IC chip extends only partially through the printed wiring board to which the translator is attached. The term printed wiring board when used to define the invention refers to standard epoxy boards, for example, FR4, to ball grid array interconnect substrates, and any other suitable interconnect substrate.

The material of the translator is preferably semiconductor, to match the coefficient of thermal expansion (CTE) of the IC chip. Most typically this will be silicon. An advantage of using silicon is that can be sufficiently conductive to serve as the bottom conductor level. Another advantage of using silicon is that the interconnection technology, for forming multiple levels of interconnections on the silicon, is well known and is used in principle in making the IC chip itself. Thus the multilevel interconnections can be made using $SiO_2$ for the interlevel dielectric and aluminum for the metallization as is standard in Si IC technology. However, the interconnections on the translator are significantly larger than those on the IC chip and can be made with a less precise and less expensive technology. Thus a preferred method for forming multilevel interconnections patterns on the translator, i.e. like levels 31–34 of FIGS. 3 and 4, is to use a spin on material for the interlevel dielectric. Spin-on materials include spin-on-glass (SOG) and a variety of known polymer materials such as polyimide. The multilayer conductor patterns may be made with any suitable metal, e.g. copper, aluminum, Au, Ti—Pd—Au, etc. The vias can be made by any suitable coating technique, e.g. sputtering. The thickness of the layers 31–34 and the interlevel dielectrics is small, so that coating the vias with a conventional sputtering process is not difficult. Via plugs can be used if desired.

Whereas silicon (or semiconductor) is the preferred material for the translator, advantages of the invention, e.g. the large area interconnection substrate with multilevel interconnect capability, can also be realized using other materials, notably ceramic. If an insulating material such as ceramic is used, a metal layer can be deposited on the insulating material for the bottom interconnection level.

As noted earlier, the invention primarily addresses IC packages wherein the IC has more than 400 I/Os. Also as noted earlier the size of the translator should be substantially larger than the IC to accommodate this large number of interconnections in the outboard region of the translator. In most package designs where a translator is used the longest dimension (length) of the translator will exceed the longest dimension of the IC by at least a factor of 2, and preferably 2.5. In terms of the area of the translator relative to the area of the IC chip, the translator area will in most cases exceed the IC chip area by a factor of at least 4, and preferably by a factor of at least 6.

Various additional modifications of this invention will occur to those skilled in the art. All deviations from the specific teachings of this specification that basically rely on the principles and their equivalents through which the art has been advanced are properly considered within the scope of the invention as described and claimed.

Figure 6:
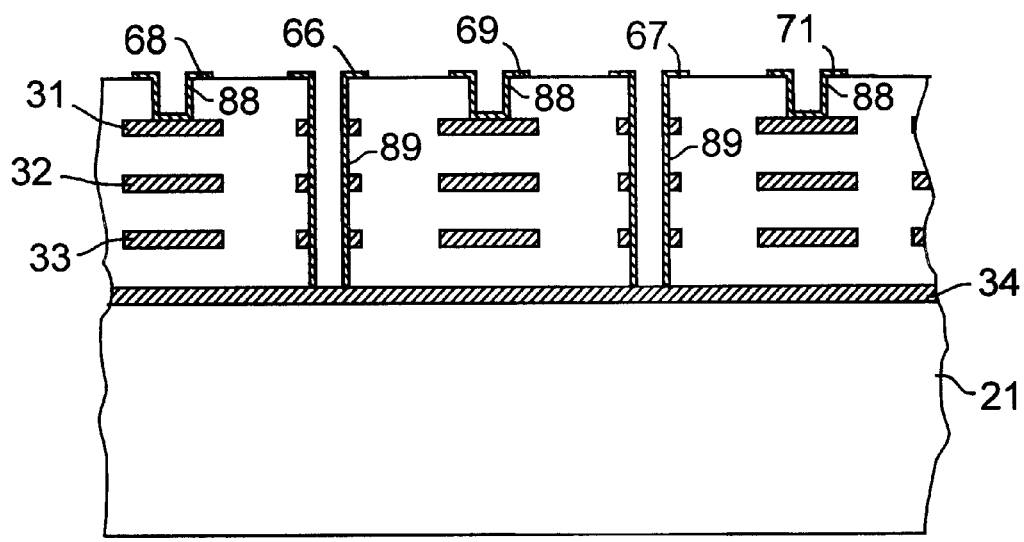
FIG. 6 is a cross section view similar to that of FIG. 3 but taken in the outboard section of the translator.
Figure 7:
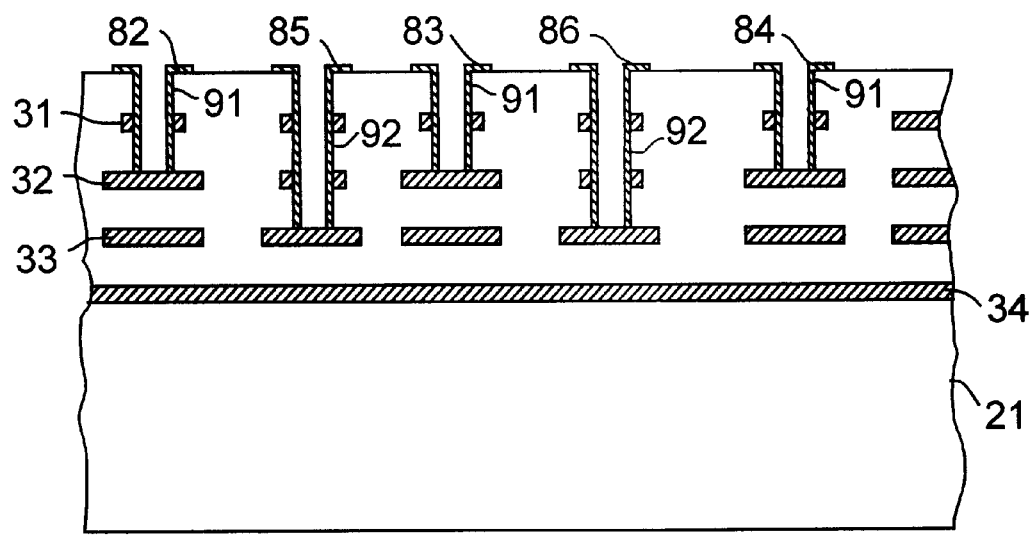
FIG. 7 is a cross section view similar to that of FIG. 4 but taken in the outboard section of the translator.

The outboard section which corresponds nearly identically with FIGS. 3 and 4, is shown for clarity in FIGS. 6 and 7. The common elements are shown, but the bonding pads to substrate conductor 34 are assigned reference numbers 66 and 67, using vias 89 for interconnection, those to metal level 33 are assigned reference numbers 85 and 86, using vias 92 for interconnection, those to metal level 32 are assigned reference numbers 82, 83, 84, using vias 91 for interconnection, and those to metal level 31 are assigned reference numbers 68, 69 and 71, using vias 88 for interconnection.

We claim:

1. An IC package comprising:
   a. a printed wiring board (PWB) 52 having an upper surface 55 and a lower surface 56, and at least one quadrilateral cavity 57 formed in said upper surface and extending at least partially through said PWB,
   b. a series of PWB bonding pads 60 on said upper surface of said PWB surrounding the edges of said cavity,
   c. a translator attached to said printed wiring board and substantially covering said cavity, said translator comprising:
      i. a substrate 21, 34 having an upper surface 53 and a lower surface 5, and an area $A_t$, said substrate having, on the lower surface thereof, a center IC chip interconnection region 15, and an outboard interconnection region 23 surrounding said center IC chip interconnection region,
      ii. a first interlevel dielectric layer 32a on the lower surface of said substrate,
      iii. a first patterned conductive layer 31 on said interlevel dielectric layer,
      iv. an insulating layer 31a on said first patterned conductive layer,
      v. a first group of translator bonding pads 36, 37 on said insulating layer, said first group of translator bonding pads located in said IC chip region, and having center-to-center spacing S,
      vi. a second group of translator bonding pads 38, 39, 41 on said insulating layer, said second group of translator bonding pads located in said center IC chip interconnection region, and having center-to-center spacing S,
      vii. a third group of translator bonding pads 66, 67 on said insulating layer, said third group of translator bonding pads located in said outboard interconnection region, and having center-to-center spacing >2S,
      viii. a fourth group of translator bonding pads 68, 69, 71 on said insulating layer, said fourth group of translator bonding pads located in said outboard interconnection region, and having center-to-center spacing >2S,
      ix. means 47 for interconnecting said first group of translator bonding pads to said substrate,
      x. means 48 for interconnecting said second group of translator bonding pads to said first patterned conductive layer,
      xi. means 89 for interconnecting said third group of translator bonding pads to said substrate,
      xii. means 51 for interconnecting said third group of translator bonding pads to PWB bonding pads, xiii. means 88 for interconnecting said fourth group of translator bonding pads to said first patterned conductive layer, xiv. means 51 for interconnecting said fourth group of translator bonding pads to PWB bonding pads, d. an IC chip 58 having an upper surface 61 and a lower surface 62, and an area $A_I$, wherein $A_t > 4A_I$, and an array of IC chip interconnections 63 on said upper surface interconnecting said IC chip to the first group and the second group of translator bonding pads, with said IC chip extending into said cavity.

2. The IC package of claim 1 wherein the said substrate is silicon.

3. The IC package of claim 2 wherein the substrate is coated with a conductive layer of metal.

4. The IC package of claim 1 in which said PWB is a ball grid array.

5. The IC package of claim 1 in which the said first group of translator bonding pads comprise power or ground interconnections.

6. The IC package of claim 1 wherein the means for bonding said IC chip bonding pads to said translator bonding pads comprises solder.

7. An IC package comprising:
   a. a translator, said translator comprising:
      i. a substrate 21, 34 having an area $A_t$,
      ii. a first insulating layer 34a on said substrate,
      iii. a first pattern of translator interconnections 33 on said first insulating layer,
      iv. a second insulating layer 33a on said first pattern of translator interconnections,
      V. a second pattern of translator interconnections 32 on said second insulating layer,
      vi. a third insulating layer 31a on said second pattern of translator interconnections,
      vii. a plurality of IC chip bonding pads on said third insulating layer, said plurality of IC chip bonding pads located in the center of said translator, and comprising a first group of IC chip bonding pads 36, 37, a second group of IC chip bonding pads 45, 46, and a third group of IC chip bonding pads 42, 43, 44,
      viii. a plurality of via interconnections 47 in said first, second and third insulating layers interconnecting said first group of IC chip bonding pads and said substrate,
      ix. a plurality of via interconnections 48 in said second and third insulating layers interconnecting said second group of IC chip bonding pads and said first pattern of translator interconnections,
      x. a plurality of via interconnections 49 in said third insulating layer interconnecting said third group of IC chip bonding pads and said second pattern of translator interconnections,
      xi. a plurality of PWB bonding pads 60 on said third insulating layer, said PWB bonding pads arranged around the outside of said plurality of IC chip bonding pads, and comprising a first group of PWB bonding pads 66, 67, a second group of PWB bonding pads 85, 86, and a third group of PWB bonding pads 82, 83, 84,
      xii. a plurality of via interconnections 89 in said first, second and third insulating layers interconnecting said first group of PWB bonding pads and said substrate,
      xiii. a plurality of via interconnections 92 in said second and third insulating layers interconnecting said second group of PWB bonding pads and said first pattern of translator interconnections,
      xiv. a plurality of via interconnections 91 in said third insulating layer interconnecting said third group of PWB bonding pads and said second pattern of translator interconnections,
   b. an IC chip 58 having an upper surface 61 and a lower surface 62, and an area $A_I$, and an array of IC chip interconnections 63 on said upper surface interconnecting said IC chip to said plurality of IC chip bonding pads on said translator, and
   c. a printed wiring board (PWB) 52 having an upper surface 55 and a lower surface 56, and at least one quadrilateral cavity 57 formed in said upper surface and extending at least partially through said PWB, and a series of PWB bonding pads 60 on said upper surface of said PWB along the edges of said cavity, with said series of PWB bonding pads bonded to said PWB bonding pads on said translator so that said IC chip is recessed into said cavity.

8. The IC package of claim 7 wherein said first group of IC chip bonding pads comprise ground I/O IC interconnections, said second group of IC chip bonding pads comprise signal I/O IC interconnections, and said third group of IC chip bonding pads comprise power or ground I/O IC interconnections.

9. The IC package of claim 7 in which $A_t > 4 A_I$.

10. The IC package of claim 9 wherein the number of IC bonding pads is greater than 400.

11. The IC package of claim 7 wherein the plurality of PWB bonding pads are arrayed along each edge of the translator.

12. The IC package of claim 7 wherein the plurality of PWB bonding pads covers the area between the IC bonding pads and the edge of the translator.

13. The IC package of claim 7 wherein the substrate is silicon.

14. The IC package of claim 7 further including a metal layer covering the substrate.

15. An IC package comprising:
   a. a translator, said translator comprising:
      i. a substrate 21, 34 having an area $A_t$,
      ii. a first insulating layer 34a on said substrate,
      iii. a first pattern of translator interconnections 33 on said first insulating layer,
      iv. a second insulating layer 33a on said first pattern of translator interconnections,
      v. a second pattern of translator interconnections 32 on said second insulating layer,
      vi. a third insulating layer 32a on said second pattern of translator interconnections,
      vii. a third pattern of translator interconnections 31 on said third insulating layer,
      viii. a fourth insulating layer 31a on said third pattern of translator interconnections,
      ix. a plurality of IC chip bonding pads on said fourth insulating layer, said plurality of IC chip bonding pads located in the center of said translator, and comprising a first group of IC chip bonding pads 36, 37, a second group of IC chip bonding pads 45, 46, a third group of IC chip bonding pads 42, 43, 44, and a fourth group of IC chip bonding pads 38, 39, 41,
      x. a plurality of via interconnections 47 in said first, second, third and fourth insulating layers interconnecting said first group of IC bonding pads and said substrate,
      xi. a plurality of via interconnections 50 in said second, third, and fourth insulting layers interconnecting said second group of IC bonding pads and said first pattern of translator interconnections, xii. a plurality of via interconnections 49 in said third and fourth insulating layers interconnecting said third group of IC bonding pads and said second pattern of translator interconnections, xiii. a plurality of via interconnections 48 in said fourth insulating layer interconnecting said fourth group of IC bonding pads and said third pattern of translator interconnections, xiv. a plurality of PWB bonding pads 60 on said fourth insulating layer, said PWB bonding pads arranged around the outside of said plurality of IC chip bonding pads, and comprising a first group of PWB bonding pads 66, 67, a second group of PWB bonding pads 85, 86, a third group of PWB bonding pads 82, 83, 84, and a fourth group of PWB bonding pads 68, 69, 71, xv. a plurality of via interconnections 89 in said first, second, third and fourth insulating layers interconnecting said first group of PWB bonding pads and said substrate, xvi. a plurality of via interconnections 92 in said second, third and fourth insulating layers interconnecting said second group of PWB bonding pads and said first pattern of translator interconnections, xvii. a plurality of via interconnections 91 in said third and fourth insulating layers interconnecting said third group of PWB bonding pads and said second pattern of translator interconnections, xviii. a plurality of via interconnections 88 in said fourth insulating layer interconnecting said fourth group of PWB bonding pads and said third pattern of translator interconnections, b. an IC chip 58 having an upper surface 61 and a lower surface 62 and an area $A_I$, and an array of IC chip interconnections 63 on said upper surface interconnecting said IC chip to said plurality of IC chip bonding pads on said translator, and c. a printed wiring board (PWB) 52 having an upper surface 55 and a lower surface 56, and at least one quadrilateral cavity 57 formed in said upper surface and extending at least partially through said PWB, and a series of PWB bonding pads 60 on said upper surface of said PWB along the edges of said cavity, with said series of PWB bonding pads bonded to said PWB bonding pads on said translator so that said IC chip is recessed into said cavity.

16. The IC package of claim 15 wherein said first group of IC chip bonding pads comprise ground I/O IC interconnections, said second and said third groups of IC chip bonding pads comprise signal I/O IC interconnections, and said fourth group of IC chip bonding pads comprise power I/O IC interconnections.

17. The IC package of claim 15 wherein the substrate is silicon.

18. The IC package of claim 15 wherein the substrate is coated with a metal layer.

* * * * *